(12) United States Patent
Chen

(10) Patent No.: US 10,074,301 B2
(45) Date of Patent: Sep. 11, 2018

(54) DISPLAY PANEL AND DRIVING METHOD THEREOF, AND DISPLAY DEVICE

(71) Applicants: BOE TECHNOLOGY GROUP CO., LTD., Beijing (CN); ORDOS YUANSHENG OPTOELECTRONICS CO., LTD., Ordos, Inner Mongolia (CN)

(72) Inventor: Junsheng Chen, Beijing (CN)

(73) Assignees: BOE TECHNOLOGY GROUP CO., LTD., Beijing (CN); ORDOS YUANSHENG OPTOELECTRONICS CO., LTD., Inner Mongolia (CN)

(*) Notice: Subject to any disclaimer, the term of this patent is extended or adjusted under 35 U.S.C. 154(b) by 0 days.

(21) Appl. No.: 14/421,980

(22) PCT Filed: May 23, 2014

(86) PCT No.: PCT/CN2014/078268
§ 371 (c)(1),
(2) Date: Feb. 16, 2015

(87) PCT Pub. No.: WO2015/096370
PCT Pub. Date: Jul. 2, 2015

(65) Prior Publication Data
US 2016/0027376 A1    Jan. 28, 2016

(30) Foreign Application Priority Data
Dec. 26, 2013   (CN) .......................... 2013 1 0739253

(51) Int. Cl.
G09G 3/32       (2016.01)
H01L 27/32      (2006.01)
(Continued)

(52) U.S. Cl.
CPC ......... *G09G 3/3208* (2013.01); *G09G 3/2003* (2013.01); *H01L 27/3211* (2013.01);
(Continued)

(58) Field of Classification Search
CPC .............. G09G 3/3208; G09G 3/2003; G09G 2300/0452; G09G 2310/08; H01L 27/3211; H01L 27/3218
See application file for complete search history.

(56) References Cited

U.S. PATENT DOCUMENTS

2004/0174389 A1    9/2004  Ben-David et al.
2006/0221027 A1*  10/2006  Ishihara ............ G02F 1/133512
                                                            345/88
(Continued)

FOREIGN PATENT DOCUMENTS

CN      102830452 A   * 12/2012
CN      103187431 A     7/2013
(Continued)

OTHER PUBLICATIONS

English translation of Written Opinion of PCT/CN2014/078268 from the ISR dated May 23, 2014 that was originally provided to the USPTO on Feb. 16, 2015 with the application.
(Continued)

*Primary Examiner* — Amare Mengistu
*Assistant Examiner* — Jennifer Zubajlo
(74) *Attorney, Agent, or Firm* — Nath, Goldberg & Meyer; Joshua B. Goldberg

(57) ABSTRACT

The present invention discloses a display panel and a driving method thereof, and a display device. The display panel comprises a matrix structure formed by arranging sub-pixels of three different colors. Two adjacent sub-pixels of the same color in the row direction form a group. The groups of three different colors are arranged in turn in the row direction, and
(Continued)

the groups of the same colors in two adjacent rows are arranged in such a manner that the groups of the same colors in the two rows are staggered by one or three sub-pixels in the row direction.

13 Claims, 7 Drawing Sheets

(51) Int. Cl.
G09G 3/20 (2006.01)
G09G 3/3208 (2016.01)

(52) U.S. Cl.
CPC . *H01L 27/3218* (2013.01); *G09G 2300/0452* (2013.01); *G09G 2310/08* (2013.01)

(56) References Cited

U.S. PATENT DOCUMENTS

| | | | | |
|---|---|---|---|---|
| 2007/0024183 | A1* | 2/2007 | Lih | H01L 51/56 313/504 |
| 2007/0075627 | A1* | 4/2007 | Kimura | H01L 27/3213 313/503 |
| 2007/0228399 | A1* | 10/2007 | Iwawaki | H01L 51/006 257/89 |
| 2008/0001525 | A1* | 1/2008 | Chao | H01L 27/3218 313/500 |
| 2009/0051638 | A1* | 2/2009 | Horiuchi | G09G 3/2003 345/88 |
| 2011/0050645 | A1* | 3/2011 | Lee | G06F 3/0412 345/175 |
| 2013/0038513 | A1* | 2/2013 | Park | H01L 27/3218 345/55 |

FOREIGN PATENT DOCUMENTS

| | | | | |
|---|---|---|---|---|
| CN | 103715227 A | 4/2014 | | |
| EP | 0 347 187 A2 | 12/1989 | | |
| EP | 0347187 A2 * | 12/1989 | ....... | G02F 1/133514 |
| JP | 2005-352140 A | 12/2005 | | |

OTHER PUBLICATIONS

Office action issued in Chinese application No. 201310739253.6 dated Sep. 25, 2015.
International Search Report for International Application No. PCT/CN2014/078268.

* cited by examiner

DISPLAY PANEL AND DRIVING METHOD THEREOF, AND DISPLAY DEVICE

This is a National Phase Application filed under 35 U.S.C. 371 as a national stage of PCT/CN2014/078268, filed May 23, 2014, an application claiming the benefit of Chinese Application No. 201310739253.6, filed Dec. 26, 2013, the content of each of which is hereby incorporated by reference in its entirety.

FIELD OF THE INVENTION

The present invention relates to the field of display technology, and particularly relates to a display panel and a driving method thereof, and a display device.

BACKGROUND OF THE INVENTION

OLED (Organic Light-Emitting Diode) display device is a novel flat panel display device. In comparison to Liquid Crystal Display (referred to as LCD), since OLED is able to emit light by itself without any backlight module, the OLED has lower power consumption than the LCD.

In an OLED display device, OLED pixel structures are generally arranged in a matrix manner. The driving modes of the OLED display device may be classified into a Passive Matrix Organic Light Emission Display (PMOLED) driving mode and an Active Matrix Organic Light Emission Display (AMOLED) driving mode. In comparison to the PMOLED pixel structure, the AMOLED pixel structure has the advantages of high resolution, high precision and the like.

At present, during the manufacturing process of an OLED display device, generally, FMMs (Fine Metal Masks) are used as evaporation masks for forming a light-emitting layer through evaporation by using light-emitting material. An opening region of an evaporation mask corresponds to a deposition region of the light-emitting material in each of sub-pixels. The smaller the opening region is, the smaller the sub-pixel is, and the smaller pixel may be obtained accordingly. Thus, the PPI (Pixels Per Inch) is higher, and the resolution and precision are higher. A fact is that the opening region cannot be fabricated as too small because the FMM mask has a certain thickness. Another fact is that the product yield is very low when evaporation masks having a smaller thickness are used to perform evaporation.

Meanwhile, present evaporation masks used for the vacuum coating of AMOLED pixel structures are mainly made of INVAR (invar alloys, also referred to as Invar, one of important structural materials) metal material. The INVAR metal material is difficult to obtain, the cost of the INVAR metal material is very high, and the width of a Rib region (i.e., a shielding region) cannot become smaller due to too large thickness of the evaporation masks, so that the PPI of AMOLED products cannot be improved substantially.

FIG. 1 shows a plan view (the upper diagram in FIG. 1) and a cross-sectional view (the lower diagram in FIG. 1, taken along the direction A-A in the upper diagram) of an evaporation mask in the prior art. In FIG. 1, the blank region is a shielding region 6 (corresponding to a non-evaporation region, i.e., the blank rectangle in the upper diagram of FIG. 1, and the trapezoid cross-section taking Rib Width and Slit Width as bottom edges in the lower diagram of FIG. 1) in the evaporation mask, and the cross-hatched region is an opening region 7 (corresponding to an evaporation region, i.e., Slit Space in FIG. 1, referred to as SP) in the evaporation mask. When the evaporation mask shown in FIG. 1 is used to shield a coating (e.g., to shield the shielding region 6 corresponding to sub-pixels G and B), a coating for forming any two of the sub-pixels in a pixel unit (comprising three sub-pixels, i.e., R, G and B) is shielded in one evaporation process. The opening region 7 of the evaporation mask in the plan view have greater influences on the performance of the evaporation than an comprised angle θ (i.e., gradient) of the evaporation mask in a thickness direction in the cross-sectional view. The specific reasons are as follows.

The width Slit Width of the shielding region 6 of the evaporation mask is:

$$\text{Slit Width} = b + 2*a = b + 2*d*c\tan(\theta) \qquad (1).$$

In the equation (1), the comprised angle θ of the evaporation mask in a thickness direction is generally ranged from 40° to 60°.

The width (i.e., the sum of widths of three sub-pixels) of the pixel pitch is:

$$\text{Slit Width} + \text{SP} \approx 1.5 * \text{Slit Width} = 1.5 * (b + 2*d*c\tan(\theta)) \qquad (2).$$

In the equation (2), b is mainly limited by precision of etching process, so the pixel pitch cannot be small enough mainly due to the thickness d of the evaporation mask.

At present, the thickness of the evaporation mask made of INVAR metal material is usually 40 μm, 30 μm at minimum. At present, even though the thinnest evaporation mask is employed, the PPI cannot be improved substantially. Moreover, by using the thinnest evaporation mask, the width cannot be remained at the original level, and the product yield will be reduced instead.

SUMMARY OF THE INVENTION

In view of the deficiencies in the prior art, a technical problem to be solved by the present invention is to provide a display panel and a driving method thereof, and a display device. When the display panel is manufactured by using an evaporation mask (FMM mask), the difficulty of evaporation is reduced, and the product yield is improved while the display quality of a display device is ensured.

According to one aspect of the present invention, there is provided a display panel, comprising a matrix structure formed by arranging sub-pixels of three different colors, wherein two adjacent sub-pixels of the same color in the row direction form a group, the groups of three different colors are arranged in turn in the row direction, and the groups of the same colors in two adjacent rows are arranged in such a manner that the groups in one row shift with respect to the groups in the other row by one or three sub-pixels in the row direction.

The display panel may comprise a plurality of pixel units; and each of the pixel units may comprise three sub-pixels of different colors, the three sub-pixels in each of the pixel units are arranged in two rows, at least one sub-pixel in each of the pixel units is adjacent to the sub-pixel of the same color in neighboring pixel unit in the row direction.

Among the three sub-pixels of different colors in the same pixel unit, the single sub-pixel in one row and one of two sub-pixels in another row may be located on the same straight line in the column direction; or, the single sub-pixel in one row may be located at a position corresponding to the middle of two sub-pixels in another row in the column direction.

In the row direction, every four adjacent pixel units may form a pixel block, and the pixel blocks are arranged repeatedly in the row direction.

Each row of the pixel block may comprise sub-pixels of three different colors, there are two sub-pixels of each color in the row direction, two sub-pixels in each of the pixel blocks in the same column direction are of different colors; in one row of the pixel block, the groups of three different colors are arranged in turn; and in another row of the pixel block, the groups of two colors are arranged adjacent to each other, and two sub-pixels of a third color are located on two sides of the two groups respectively.

The three sub-pixels of different colors in each of the pixel units may be a red sub-pixel, a green sub-pixel and a blue sub-pixel respectively.

The display panel may be an OLED display panel, each of the sub-pixels may comprise a light-emitting layer, and the light-emitting layers of the sub-pixels of three different colors in the same pixel unit may be a red light-emitting layer, a green light-emitting layer and a blue light-emitting layer respectively.

According to another aspect of the present invention, there is provided a display device, comprising the display panel described above.

According to still another aspect of the present invention, there is provided a driving method of a display panel, wherein in the row direction of the display panel, every four adjacent pixel units form a pixel block, each of the pixel units comprises three sub-pixels of different colors, at least one sub-pixel in each of the pixel units is adjacent to the sub-pixels of the same color in neighboring pixel units in the row direction; and the driving method comprises: non-simultaneously driving the pixel units at different positions in the same pixel block, and simultaneously driving the pixel units at the same position in each of the pixel blocks.

The driving order of the pixel units at different positions in the same pixel block may be 4i+1, 4i+2, 4i+3 and 4i+4 in turn, and the pixel units at the corresponding positions of 4i+1, 4i+2, 4i+3 and 4i+4 in each of the pixel blocks are simultaneously driven respectively, wherein i is the sequence number of each of the pixel blocks from left to right or from right to left in the row direction, and i is an integer greater than or equal to 0.

Within a frame period, the charging time of the pixel units successively driven according to the driving order in each of the pixel blocks may be lagged by ¼ of the charging time in turn, and the ON hold time of all the pixel units in each of the pixel blocks may be the same.

In the display panel provided by embodiments of the present invention, two adjacent sub-pixels in the row direction are of the same color, so that the opening regions of two sub-pixels in the row direction may be merged when an evaporation mask (FMM mask) is used to manufacture pixel units. Accordingly, the structure of the evaporation mask becomes simpler, the difficulty of evaporation is reduced, and the problem that the size of the opening region of the evaporation mask cannot be decreased is overcome. By optimizing the arrangement of sub-pixels, the effect of improving PPI is realized, and the product yield is also improved while the display quality of a display device is ensured.

BRIEF DESCRIPTION OF THE DRAWINGS

FIGS. 3A through 3D are schematic diagrams illustrating arrangements of pixel units in the first embodiment of the present invention, wherein:

FIG. 3A is a schematic diagram illustrating an arrangement of mode Dot A;

FIG. 3B is a schematic diagram illustrating an arrangement of mode Dot B;

FIG. 3C is a schematic diagram illustrating an arrangement of mode Dot C; and

FIG. 3D is a schematic diagram illustrating an arrangement of mode Dot D.

FIGS. 6A through 6C are schematic diagrams illustrating patterns of mask plates in the first embodiment of the present invention, wherein:

FIG. 6A is a schematic diagram illustrating a pattern of a mask plate used for forming sub-pixels of a first color;

FIG. 6B is a schematic diagram illustrating a pattern of a mask plate used for forming sub-pixels of a second color; and FIG. 6C is a schematic diagram illustrating a pattern of a mask plate used for forming sub-pixels of a third color.

DETAILED DESCRIPTION OF THE EMBODIMENTS

To make those skilled in the art better understand the technical solutions of the present invention, the display panel and driving method thereof and the display device provided by the present invention will be further described below in details with reference to the accompanying drawings and specific implementations.

First Embodiment

According to one aspect of the present invention, there is provided a display panel, comprising a matrix structure formed by arranging sub-pixels of three different colors, wherein two adjacent sub-pixels having the same color in the row direction constitute a group, the groups of three different colors are arranged in turn in the row direction, and the groups of the same colors in two adjacent rows are arranged in such a manner that the groups of the same colors in the two rows are staggered by one or three sub-pixels in the row direction.

It should be noted that, in this embodiment of the present invention, the groups of the same color in two adjacent rows may be arranged in such a manner that the groups in one row shift by an odd number (e.g., one or three) of sub-pixels with respect to the groups in the other row, so as to realize better effect of color mixing. Further, by arranging the groups of the same colors in two adjacent rows in a manner of staggering the groups of the same colors in the two rows by three sub-pixels, the distribution of the sub-pixels of various colors in the whole display panel may be more uniform, and the better display performance may be thus achieved. For example, if the three different colors are red (R), green (G)

and blue (B) respectively, then in the first row of the display panel, the sub-pixels in both the first and second columns are red sub-pixels, the sub-pixels in both the third and fourth columns are green sub-pixels, and the sub-pixels in both the fifth and sixth columns are blue sub-pixels. Accordingly, in the second row, the red sub-pixels are located in the fourth and fifth columns, the green sub-pixels are located in the first and sixth columns, and the blue sub-pixels are located in the second and third columns. The other arrangement manners are similar to this arrangement manner and the description thereto will not be omitted herein.

Figure 1:
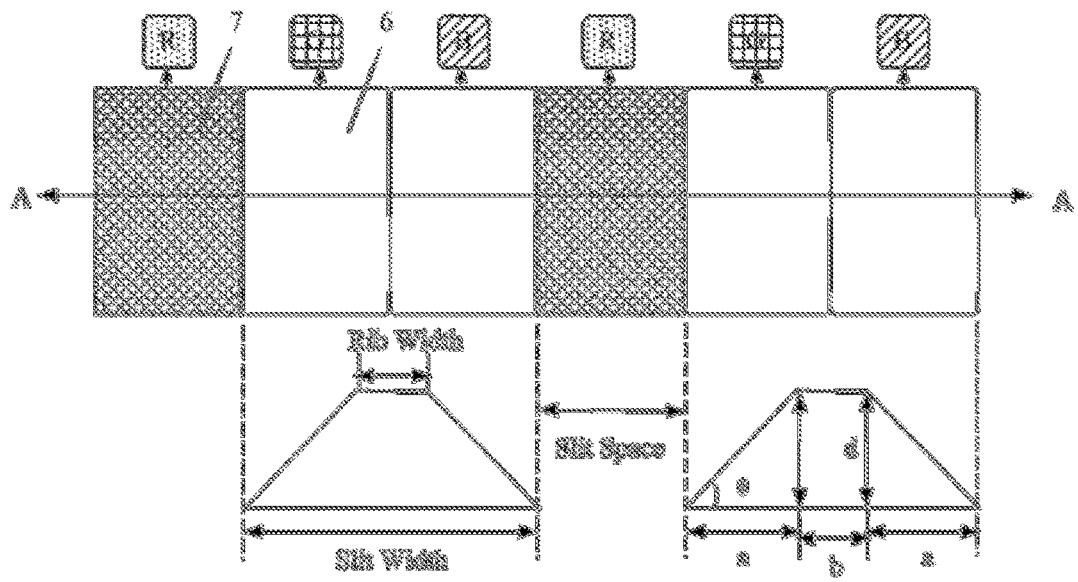
FIG. 1 is a schematic diagram illustrating pattern of an evaporation mask in the prior art.
Figure 2:
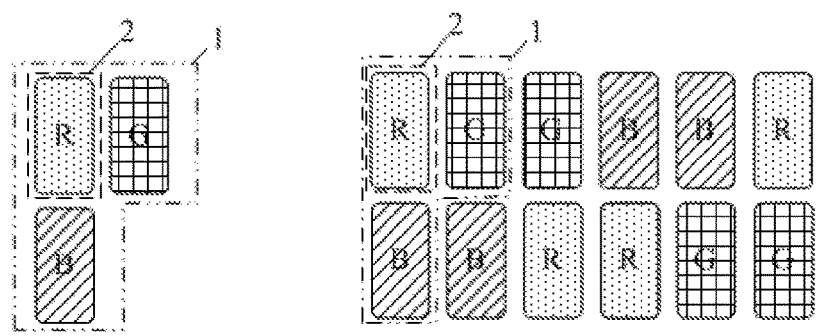
FIG. 2 is a schematic diagram (left diagram) illustrating an arrangement of pixel unit and a schematic diagram (right diagram) illustrating an arrangement of pixel block in a first embodiment of the present invention.

Specifically, the display panel comprises a plurality of pixel units 1. As shown in FIG. 2, each of the pixel units 1 comprises three sub-pixels 2 of different colors. The three sub-pixels 2 in each of the pixel units 1 are arranged in two rows, and at least one sub-pixel 2 in each of the pixel units 1 is adjacent to the sub-pixel 2 of the same color in neighboring pixel unit 1 in the row direction.

As shown in FIGS. 3A through 3D, in this embodiment, the three sub-pixels 2 of different colors in each of the pixel units 1 are one red sub-pixel, one green sub-pixel and one blue sub-pixel respectively; and among the three sub-pixels 2 of different colors in the same pixel unit 1, the single sub-pixel in one row and one of two sub-pixels in another row are located on the same straight line in the column direction.

As each of the pixel units 1 comprises three sub-pixels 2 of different colors, when adjacent sub-pixels 2 have the same color pairwise in the row direction, it is required to have four pixel units at least. In the row direction, every four adjacent pixel units 1 constitute a pixel block 3, and the pixel blocks 3 are arranged repeatedly in the row direction. That is, each of the pixel blocks 3 comprises four adjacent pixel units 1 in the row direction, each of the pixel units 1 comprises three sub-pixels 2 of different colors, the three sub-pixels 2 in each of the pixel units 1 are arranged in two rows, and at least one sub-pixel 2 in each of the pixel units 1 is adjacent to the sub-pixel 2 of the same color in neighboring pixel unit 1 in the row direction.

Figure 4:
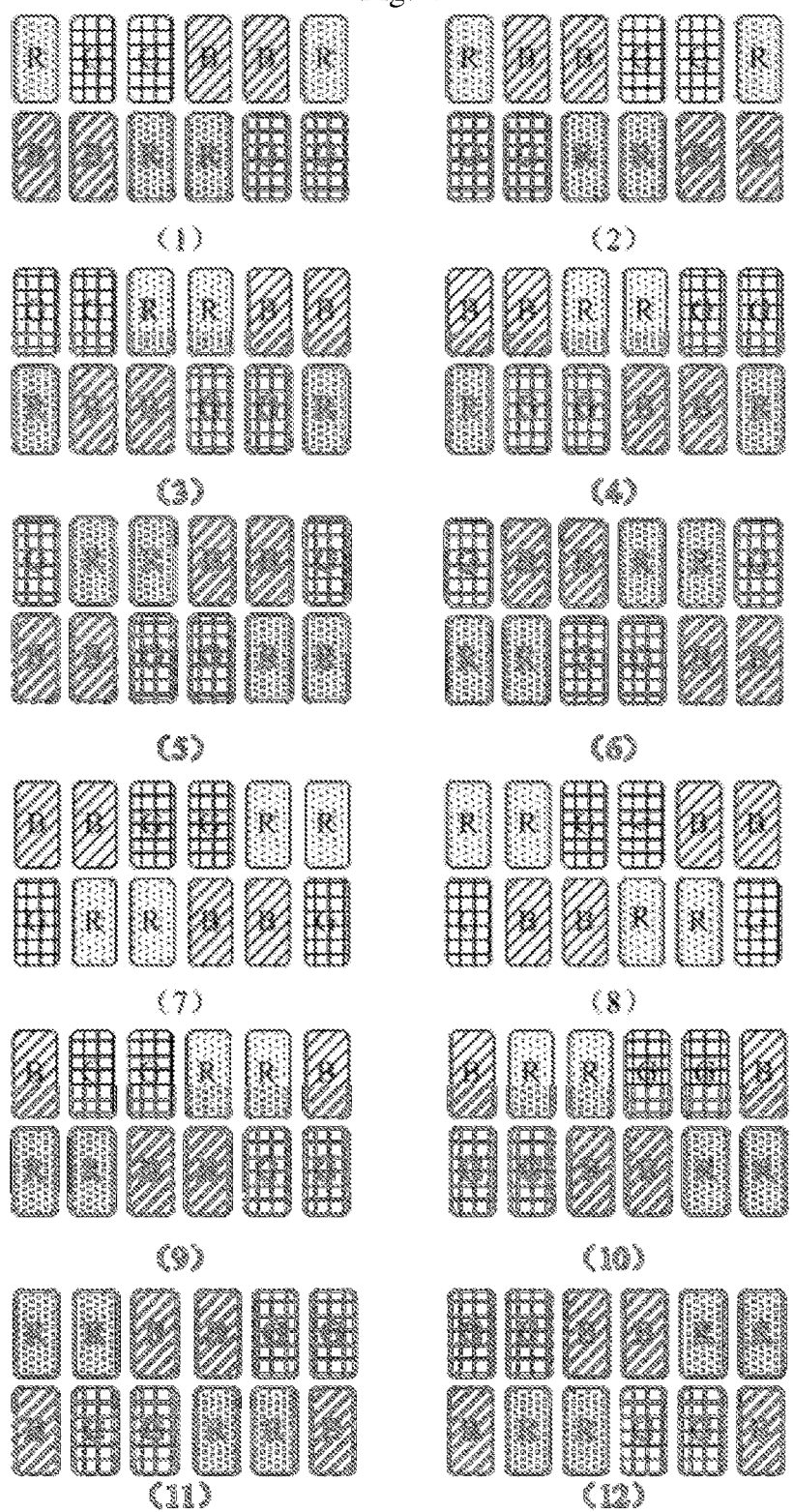
FIG. 4 is a schematic diagram illustrating arrangements of pixel blocks in the first embodiment of the present invention.

The arrangement structure of the four adjacent pixel units 1 in the row direction in one pixel block 3 are shown in FIG. 4. FIG. 4 shows twelve possible arrangement structures of the four adjacent pixel units 1 in the row direction in one pixel block 3. In FIG. 4, one pixel block 3 comprises twelve sub-pixels 2. The twelve sub-pixels 2 are arranged into a matrix of 2×6. Each row of the pixel block 3 comprises sub-pixels 2 of three different colors, and there are two sub-pixels of each color in the row direction. In addition, the two sub-pixels 2 of each column of the pixel block 3 are of different colors. Two adjacent sub-pixels 2 of the same color in the row direction constitute a group. In one row of the pixel block 3, the groups of three different colors are arranged in turn; while in another row of the pixel block 3, the groups of two colors are arranged adjacent to one another, and the two sub-pixels 2 of a third color are located on two sides of the two groups respectively. In this embodiment, two sub-pixels 2 opposite to each other in the vertical direction form a column.

In each of the pixel blocks 3, the arrangement structure of adjacent pixel units 1 may be in a complementary manner. For example, two pixel units 1 located on the relative outer side in a pixel block 3 and the pixel units 1 adjacent thereto may be arranged in such a manner that two sub-pixels of identical color in the row direction form a group. Alternatively, the arrangement structure of adjacent pixel units 1 may be arranged oppositely. For example, two pixel units 1 located on the relative inner side in a pixel block 3 may be arranged in such a manner that two sub-pixels of identical color in the row direction form a group.

Figure 3A:
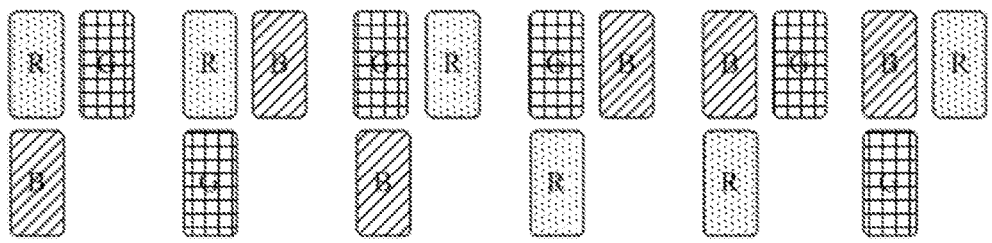
Figure 3B:
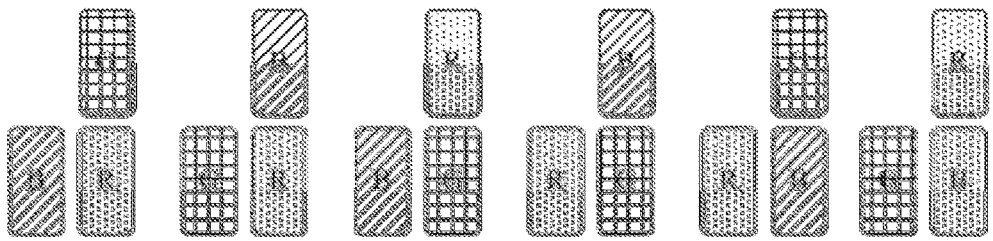
Figure 3C:
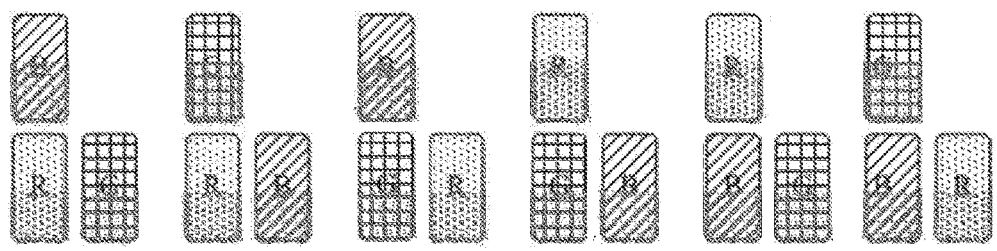
Figure 3D:
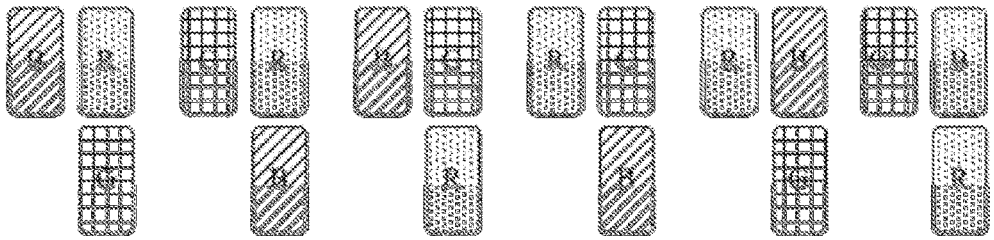

Specifically, the specific arrangement modes of sub-pixels 2 in four adjacent pixel units 1 in the row direction forming one pixel block are shown in FIGS. 3A through 3D. When three sub-pixels 2 in the first pixel unit 1 of the pixel block are arranged in form of ":·", there may be six arrangement modes according to the randomicity of three colors R, G and B. As shown in FIG. 3A, the arrangement mode of the pixel unit is marked as mode Dot A. In order to ensure the compactness of the space between adjacent pixel units 1 in the row direction, the three sub-pixels 2 arranged in the second pixel unit 1 of the pixel block in the row direction are arranged in form of "·∶", such that the structures of the sub-pixels 2 of two adjacent pixel units 1 in the row direction are complementary to one another, and as shown in FIG. 3B, this arrangement mode of the pixel unit is marked as mode Dot B. That is, to meet the requirement that two adjacent sub-pixels 2 in the row direction have the same color, after the colors and arrangement positions of the three sub-pixels 2 in the first pixel unit 1 of the pixel block are determined, the colors and arrangement positions of the sub-pixels 2 in the second pixel unit 1 adjacent thereto in the pixel block are fixed. It should be easily understood that, similarly, in order to meet the requirement that two adjacent sub-pixels 2 in the row direction have the same color, when the sub-pixels 2 in the third pixel unit 1 of the pixel block are arranged in form of "∶·" (this arrangement mode of the pixel unit is marked as mode Dot C, as shown in FIG. 3C), the sub-pixels 2 in the fourth pixel unit 1 of the pixel block are arranged in form of "·∶" (this arrangement mode of the pixel unit is marked as mode Dot D, as shown in FIG. 3D). The first to fourth pixel units of the pixel block refer to first to fourth pixel units in the pixel block from left to right, or first to fourth pixel units in the pixel block from right to left, similarly hereinafter.

Specifically, as shown in FIG. 4, the arrangement mode of twelve sub-pixels 2 in one pixel block 3 is one of the following twelve arrangement modes: (1) the first row: RGGBBR, and the second row: BBRRGG; (2) the first row: RBBGGR, and the second row: GGRRBB; (3) the first row: GGRRBB, and the second row: RBBGGR; (4) the first row: BBRRGG, and the second row: RGGBBR; (5) the first row: GRRBBG, and the second row: BBGGRR; (6) the first row: GBBRRG, and the second row: RRGGBB; (7) the first row: BBGGRR, and the second row: GRRBBG; (8) the first row: RRGGBB, and the second row: GBBRRG; (9) the first row: BGGRRB, and the second row: RRBBGG; (10) the first row: BRRGGB, and the second row: GGBBRR; (11) the first row: RRBBGG, and the second row: BGGRRB; and (12) the first row: GGBBRR, and the second row: BRRGGB.

To form a pixel matrix of the display device, the pixel blocks 3 in any one of the above arrangement modes may be arranged repeatedly in the row direction (in two rows or a plurality of even rows), or the pixel blocks 3 in any one of the above arrangement modes may be arranged mixedly in the row direction (in a plurality of even rows). The arrangement mode of sub-pixels of the whole display panel in the display device refers to FIG. 5, the arrangement mode of sub-pixels in each pixel block 3 may be any one of the twelve possible arrangement modes of sub-pixels in one pixel block shown in FIG. 4.

Figure 5:
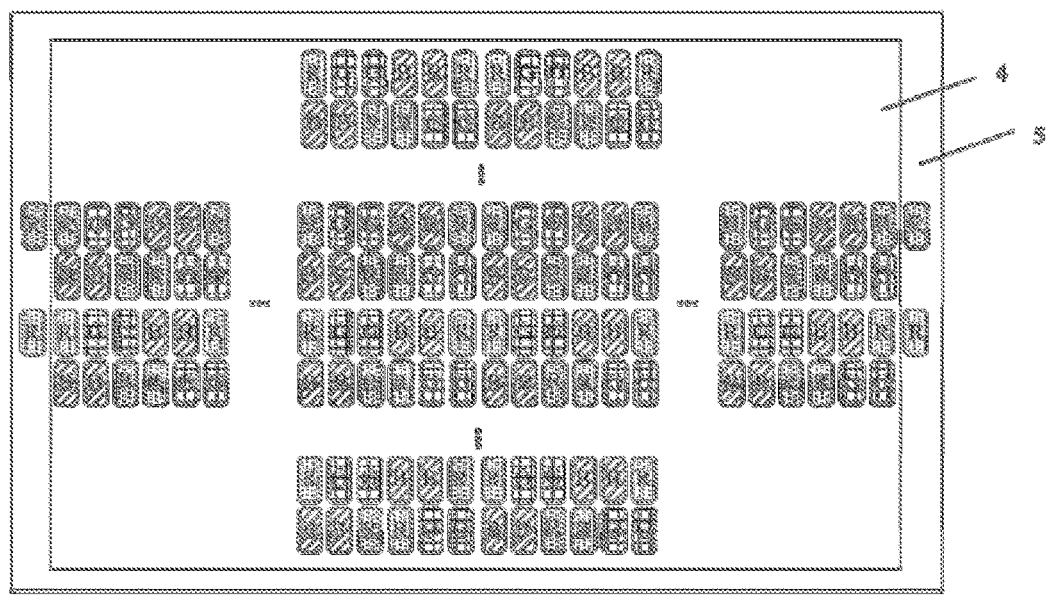
FIG. 5 is a structural diagram illustrating an overall arrangement of sub-pixels in a display panel in the first embodiment of the present invention.

As shown in FIG. 5, the display panel comprises a display region 4 and a non-display region 5, the sub-pixels 2 within the display region 4 are an effective pixel structure used for displaying an image. It can be easily seen that adjacent sub-pixels 2 in the row direction within the display region 4 have the same color pairwise; and the sub-pixels 2 within the non-display region 5 form adjacent groups of the same color in the row direction together with the sub-pixels 2 within the display region 4, and the sub-pixels 2 within the non-display region 5 may be manufactured or not manufactured in a practical display device.

In an OLED display device, the display panel is an OLED display panel, each of the sub-pixels 2 comprises a light-emitting layer, and the light-emitting layers of the sub-pixels 2 of three different colors in the same pixel unit 1 may be a red light-emitting layer, a green light-emitting layer and a blue light-emitting layer, respectively.

Figure 6A:
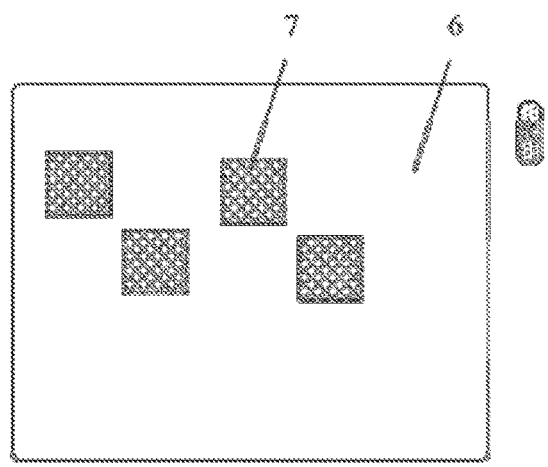
Figure 6B:
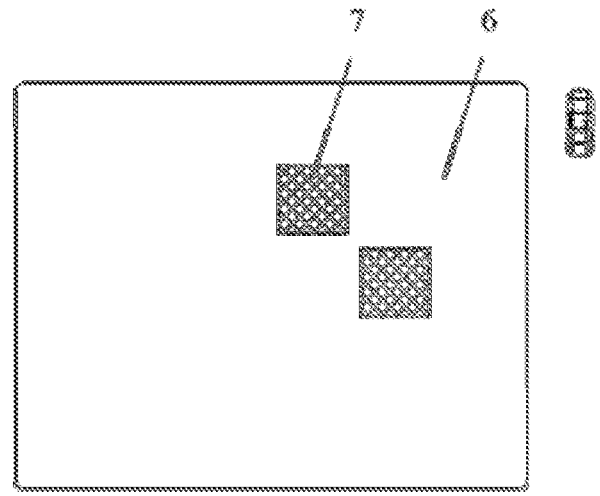
Figure 6C:
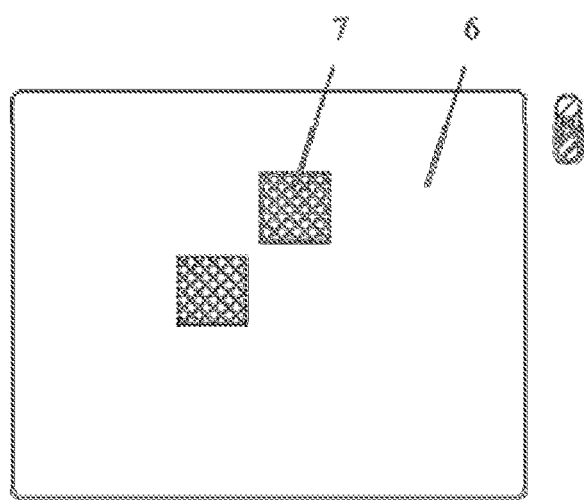

In the above display panel, the light-emitting layers of the sub-pixels 2 of the same color in the pixel units 1 may be formed in the same evaporation process. During the process of forming the light-emitting layers, as shown in FIGS. 6A through 6C, in the evaporation masks (i.e., FMM masks) used in the evaporation process, an opening region 7 may be used for forming the light-emitting layers of the sub-pixels of the same color in the pixel units. FIG. 6A is a schematic diagram illustrating pattern of an evaporation mask used for forming the light-emitting layers of the sub-pixels 2 of a first color, for example, the light-emitting layers of red sub-pixels; FIG. 6B is a schematic diagram illustrating pattern of an evaporation mask used for forming the light-emitting layers of the sub-pixels 2 of a second color, for example, the light-emitting layers of green sub-pixels; and FIG. 6C is a schematic diagram illustrating pattern of an evaporation mask used for forming the light-emitting layers of the sub-pixels 2 of a third color, for example, the light-emitting layers of blue sub-pixels. In FIGS. 6A through 6C, the blank region is the shielding region 6 in the evaporation mask, and the cross-hatched region is the opening region 7 in the evaporation mask.

In this embodiment, as the light-emitting layers of adjacent sub-pixels 2 in the row direction have the same color pairwise, the size of the opening region (the area of each opening region corresponds to sum of the areas of the light-emitting layers of two adjacent sub-pixels 2 of the same color in the row direction) of an evaporation mask in the row direction becomes larger, so that the structure of the evaporation mask becomes simpler, the difficulty of evaporation process is reduced, and the product yield is easily ensured. Meanwhile, during the evaporation process of forming the light-emitting layers, as the opening regions corresponding to the light-emitting layers of two adjacent sub-pixels 2 of the same color in the row direction are combined together, the light-emitting layers of two adjacent sub-pixels of the same color may be formed simultaneously. Therefore, in comparison to an evaporation mask having opening regions of the same size in the prior art, the same opening region may correspondingly form the light-emitting layers of two sub-pixels of the same color. Thus, by using the arrangement structure of the pixel units in this embodiment, the PPI of the display panel in this embodiment may be two times of the PPI in the prior art, so that the PPI is doubled, and the resolution of the display panel is thus improved.

In the display panel of this embodiment, every four adjacent pixel units in the row direction constitute one pixel block. Corresponding to the display panel in this embodiment, according to another aspect of the present invention, there is provided a driving method of a display panel, comprising: non-simultaneously driving the pixel units at different positions in the same pixel block, and simultaneously driving the pixel units at the same position in each of the pixel blocks. As shown in FIG. 5, the first pixel unit, second pixel unit, third pixel unit and fourth pixel unit in a single pixel block are apparently located at "different positions" respectively, and these four pixel units will not be driven at the same time; however, in different pixel blocks, the pixel units having a relatively identical sequence number (i.e., the pixel units located at the same position in the pixel blocks), for example, all pixel units located at the first "corresponding positions" of the pixel blocks will be driven simultaneously, all pixel units located at the second "corresponding positions" of the pixel blocks will be driven simultaneously, all pixel units located at the third "corresponding positions" of the pixel blocks will be driven simultaneously, and all pixel units located at the fourth "corresponding positions" of the pixel blocks will be driven simultaneously.

For example, the driving order of the pixel units (each of the pixel units comprises three sub-pixels of different colors) located at different positions in the same pixel block is $4i+1$, $4i+2$, $4i+3$ and $4i+4$ in turn, and the pixel units (each of the pixel units comprises three sub-pixels of different colors) at the corresponding positions of $4i+1$, $4i+2$, $4i+3$ and $4i+4$ in each of the pixel blocks are simultaneously driven respectively, wherein i is the sequence number of each of the pixel blocks from left to right or from right to left in the row direction, and i is an integer greater than or equal to 0. In other words, in the display device using the display panel, an image to be displayed is split into $4j$ sub-images in advance, wherein j is the number of pixel blocks 3 in the display panel. Each of the sub-images corresponds to one pixel block 3, and 4 sub-images corresponding to each of the pixel blocks 3 correspond to pixel units arranged in the mode Dot A, the mode Dot B, the mode Dot C and the mode Dot D, respectively. The pixel units 1 in each of the pixel blocks 3 are driven in the sequence of mode Dot A (the 1st, 5th, 9th, . . . pixel units in the row direction), mode Dot B (the 2nd, 6th, 10th, . . . pixel units in the row direction), mode Dot C (the 3rd, 7th, 11th, . . . pixel units in the row direction) and mode Dot D (the 4st, 8th, 12th, . . . pixel units in the row direction) in turn (that is, all pixel units of the mode Dot A in the pixel blocks 3 are driven simultaneously, all pixel units of the mode Dot B are driven simultaneously, all pixel units of the mode Dot C are driven simultaneously, and all pixel units of the mode Dot D are driven simultaneously), so that the image to be displayed is displayed in four stages. Due to the persistence of vision of human eye retinas, human eyes can watch the complete image to be displayed.

To ensure the display quality of an image to be displayed, for example, within a frame period, the charging time of the pixel units successively driven according to the driving order in each of the pixel blocks are lagged by ¼ of the charging time in turn, and the ON hold time of all the pixel units in each of the pixel blocks are the same.

Figure 7:
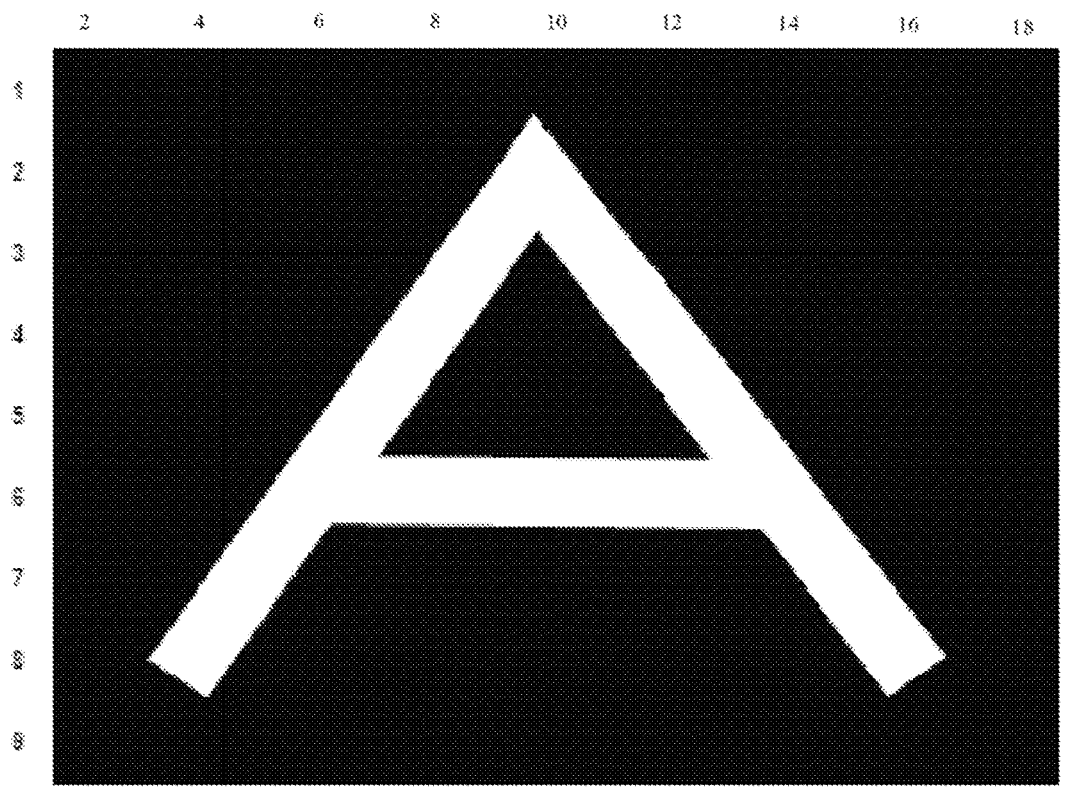
FIG. 7 shows an example of an image to be displayed.
Figure 8:
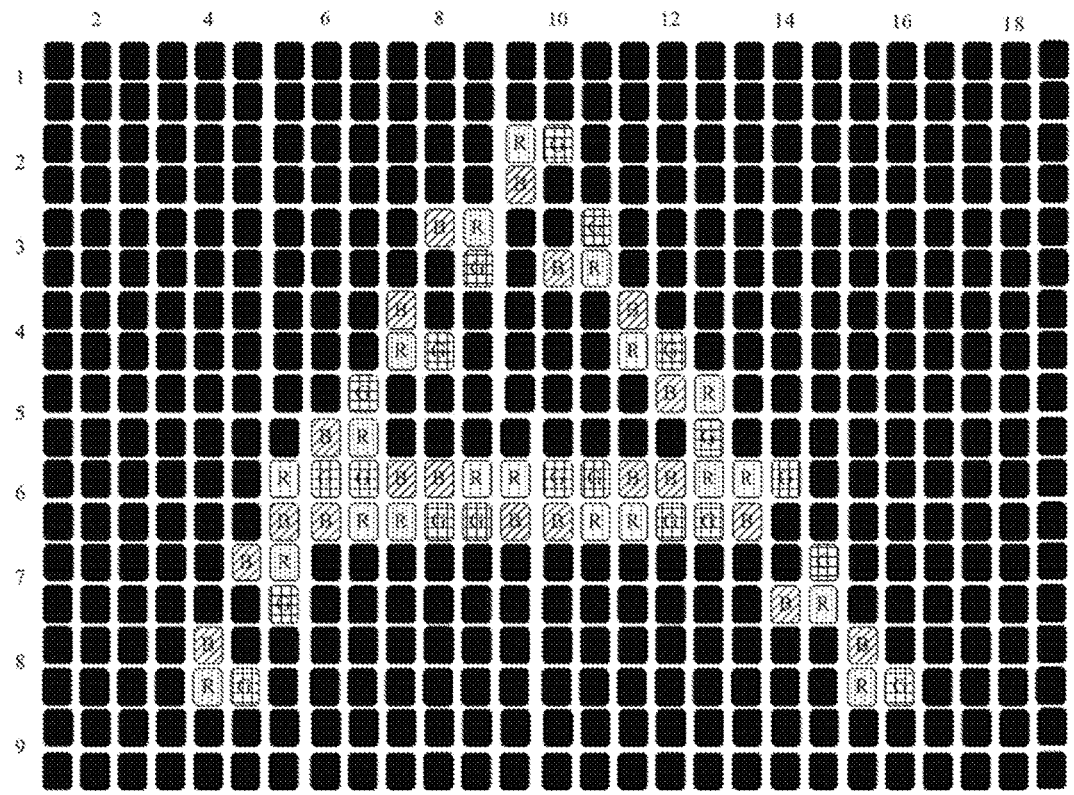
FIG. 8 is a schematic diagram illustrating the display situation of pixel units while displaying the image shown in FIG. 7.
Figure 9:
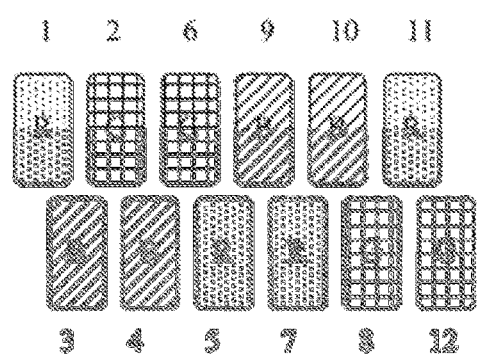
FIG. 9 is a diagram illustrating an arrangement of pixel block in a second embodiment of the present invention.

Taking the display of the image to be displayed (uppercase A) shown in FIG. 7 as example, the display situation of the corresponding pixel units in this embodiment is shown in FIG. 8. In FIGS. 7 and 8, 9×18 pixel units are comprised, and six sub-pixels at the intersections of every two adjacent rows and three adjacent columns form two pixel units. In FIG. 8, the black pixel units are at an OFF state, i.e., a non-display state, and the pixel units showing a pattern are at an ON state, i.e., a display state.

Of course, the driving method of a display device is merely an exemplary driving method, which is a simplified case without considering the arrangement of signal scanning lines and data lines in a display panel. Other driving orders other than the driving order of 4i+1, 4i+2, 4i+3 and 4i+4 may also be employed for the pixel units, and this is not limited here.

Second Embodiment

This embodiment provides a display panel. In comparison to the display panel in the first embodiment, the relative positions of sub-pixels in the same pixel unit are different in this display panel.

In this embodiment, as with the first embodiment, two sub-pixels of each row of each pixel block are of different colors; two adjacent sub-pixels of the same color in the row direction constitute a group; in one row of each pixel block, the groups of three different colors are arranged in turn, while in another row of the pixel block, the groups of two colors are arranged adjacent to one another, and two sub-pixels of a third color are located on two sides of the two groups respectively. Different from the first embodiment, in order to increase the uniformity of mixed light, two rows of sub-pixels of each pixel block in this embodiment are arranged in such a manner that one row of the sub-pixels shift by half of the sub-pixels with respect to the other row of the sub-pixels.

As shown in FIG. 9, among the sub-pixels of three different colors in the same pixel unit, the single sub-pixel in one row is located at a position corresponding to the middle of two sub-pixels in another row in the column direction. Similarly, according to the arrangement mode of sub-pixels of three different colors of the same pixel unit in the first embodiment, twelve arrangement modes may be formed by exchanging the positions of the sub-pixels of three different colors (e.g. a red sub-pixel, a blue sub-pixel and a green sub-pixel) and will not be repeated here.

If the display panel in this embodiment is an OLED display panel, during the process of forming light-emitting layers of sub-pixels, the positions of the opening regions for forming the light-emitting layers of sub-pixels of the same color in evaporation masks are also adjusted correspondingly. Meanwhile, in comparison to the opening region for forming the light-emitting layer of one sub-pixel in the prior art, the opening region used for forming light-emitting layers of two adjacent sub-pixels of the same color in the row direction may be of the same size and may form the light-emitting layers of two sub-pixels of the same color, so that the PPI is doubled.

The driving method of the display panel in this embodiment is the same as the driving method of the display panel in the first embodiment and will not be repeated here.

Third Embodiment

In this embodiment, there is provided a display device, comprising the display panel in the first or second embodiment.

The display device may be any product or component with a display function, such as an electronic paper, an OLED panel, a mobile phone, a tablet computer, a TV set, a display, a notebook computer, a digital photo frame and a navigator.

The first and second embodiments provide a novel display panel. In this display panel, as adjacent sub-pixels in the row direction have the same color pairwise, the opening regions for forming two sub-pixels of the same color in the row direction may be merged during the process of manufacturing pixel units by using evaporation masks (FMM Masks), so that the structure of the evaporation masks becomes simpler, the difficulty of evaporation is reduced, and the problem that the size of an opening region of an evaporation mask cannot be reduced is overcome. Meanwhile, by optimizing the arrangement of sub-pixels, the effect of improving the PPI is realized, and the product yield is also improved while the display quality of a display device is ensured.

The pixel units in the display panel provided by the present invention are also applicable to PMOLED display devices (in actual production, evaporation masks for PMOLED vacuum coating are mainly made of SUS material) and AMOLED display devices (in actual production, evaporation masks for AMOLED vacuum coating are mainly made of INVAR metal material), and particularly applicable to large-size ultrahigh-resolution AMOLED display devices.

It should be understood that, the above implementations are merely exemplary implementations used for illustrating the principle of the present invention, but the present invention is not limited thereto. Those of ordinary skill in the art may make various variations and improvements without departing from the spirit and essence of the present invention, and these variations and improvements are deemed as falling within the protection scope of the present invention.

The invention claimed is:

1. A display panel, comprising a matrix structure formed by arranging sub-pixels of three different colors,
    wherein the display panel comprises a plurality of pixel units, each of the pixel units comprises three sub-pixels of different colors, the three sub-pixels in each of the pixel units are arranged in two adjacent rows, at least one sub-pixel in each of the pixel units is adjacent to a sub-pixel of a same color in neighboring pixel unit in a row direction, and each of the pixel units is capable of being applied with a driving signal different from that of an adjacent one of the pixel units, such that a driving signal of the at least one sub-pixel in each of the pixel units is different from that of the adjacent sub-pixel of the same color in the neighboring pixel unit in the row direction,
    wherein two adjacent sub-pixels having the same color in the row direction constitute a group, the groups of three different colors are arranged in turn in the row direction,
    wherein among the three sub-pixels of different colors in each of the pixel units, a single sub-pixel in one row is located at a position that corresponds, in a column direction, to a middle of two sub-pixels in another row, and
    wherein in the row direction of the display panel, every four adjacent pixel units of the plurality of pixel units constitute a pixel block, and the pixel units at different positions in the same pixel block are non-simultaneously driven, and the pixel units at the same position in each of the pixel blocks are simultaneously driven.

2. The display panel according to claim 1, wherein in the row direction, every four adjacent pixel units constitute a pixel block, and the pixel blocks are arranged repeatedly in the row direction.

3. The display panel according to claim 2, wherein each row of the pixel block comprises sub-pixels of three different colors, there are two sub-pixels of each color in the row direction, two sub-pixels in each of the pixel blocks in the same column direction are of different colors; in one row of the pixel block, the groups of three different colors are arranged in turn; and in another row of the pixel block, the groups of two colors are arranged adjacent to each other, and two sub-pixels of a third color are located on two sides of the two groups respectively.

4. The display panel according to claim 3, wherein the three sub-pixels of different colors in each of the pixel units comprise a red sub-pixel, a green sub-pixel and a blue sub-pixel.

5. The display panel according to claim 4, wherein the display panel is an OLED display panel, each of the sub-pixels comprises a light-emitting layer, and the light-emitting layers of the sub-pixels of three different colors in the same pixel unit comprise a red light-emitting layer, a green light-emitting layer and a blue light-emitting layer.

6. A display device, comprising a display panel, the display panel comprising a matrix structure formed by arranging sub-pixels of three different colors,
wherein the display panel comprises a plurality of pixel units, each of the pixel units comprises three sub-pixels of different colors, the three sub-pixels in each of the pixel units are arranged in two adjacent rows, at least one sub-pixel in each of the pixel units is adjacent to a sub-pixel of a same color in neighboring pixel unit in a row direction, and each of the pixel units is capable of being applied with a driving signal different from that of an adjacent one of the pixel units, such that a driving signal of the at least one sub-pixel in each of the pixel units is different from that of the adjacent sub-pixel of the same color in the neighboring pixel unit in the row direction,
wherein two adjacent sub-pixels having the same color in the row direction constitute a group, the groups of three different colors are arranged in turn in the row direction,
wherein among the three sub-pixels of different colors in each of the pixel units, a single sub-pixel in one row is located at a position that corresponds, in a column direction, to a middle of two sub-pixels in another row, and
wherein in the row direction of the display panel, every four adjacent pixel units of the plurality of pixel units constitute a pixel block, and the pixel units at different positions in the same pixel block are non-simultaneously driven, and the pixel units at the same position in each of the pixel blocks are simultaneously driven.

7. The display device according to claim 6, wherein in the row direction, every four adjacent pixel units constitute a pixel block, and the pixel blocks are arranged repeatedly in the row direction.

8. The display device according to claim 7, wherein each row of the pixel block comprises sub-pixels of three different colors, there are two sub-pixels of each color in the row direction, two sub-pixels in each of the pixel blocks in the same column direction are of different colors; in one row of the pixel block, the groups of three different colors are arranged in turn; and in another row of the pixel block, the groups of two colors are arranged adjacent to each other, and two sub-pixels of a third color are located on two sides of the two groups respectively.

9. The display device according to claim 8, wherein the three sub-pixels of different colors in each of the pixel units comprise a red sub-pixel, a green sub-pixel and a blue sub-pixel.

10. The display device according to claim 9, wherein the display panel is an OLED display panel, each of the sub-pixels comprises a light-emitting layer, and the light-emitting layers of the sub-pixels of three different colors in the same pixel unit comprise a red light-emitting layer, a green light-emitting layer and a blue light-emitting layer.

11. A driving method of a display panel, wherein in the row direction of the display panel, every four adjacent pixel units constitute a pixel block, each of the pixel units comprises three sub-pixels of different colors, the three sub-pixels in each of the pixel units are arranged in two adjacent rows, and at least one sub-pixel in each of the pixel units is adjacent to a sub-pixel of a same color in neighboring pixel unit in a row direction, and each of the pixel units is capable of being applied with a driving signal different from that of an adjacent one of the pixel units, such that a driving signal of the at least one sub-pixel in each of the pixel units is different from that of the adjacent sub-pixel of the same color in the neighboring pixel unit in the row direction;
and wherein among the three sub-pixels of different colors in each of the pixel units, a single sub-pixel in one row is located at a position that corresponds, in a column direction, to a middle of two sub-pixels in another row,
wherein the driving method comprises: non-simultaneously driving the pixel units at different positions in the same pixel block, and simultaneously driving the pixel units at the same position in each of the pixel blocks.

12. The driving method according to claim 11, wherein the driving order of the pixel units at different positions in the same pixel block is $4i+1$, $4i+2$, $4i+3$ and $4i+4$ in turn, and the pixel units at the corresponding positions of $4i+1$, $4i+2$, $4i+3$ and $4i+4$ in each of the pixel blocks are simultaneously driven, respectively, wherein i is the sequence number of each of the pixel blocks from left to right or from right to left in the row direction, and i is an integer greater than or equal to 0.

13. The driving method according to claim 12, wherein within a frame period, the charging time of the pixel units successively driven according to the driving order in each of the pixel blocks are lagged by ¼ of the charging time in turn, and the ON hold time of all the pixel units in each of the pixel blocks are the same.

* * * * *